United States Patent
Kim

(10) Patent No.: US 6,924,973 B2
(45) Date of Patent: Aug. 2, 2005

(54) LIGHT EMITTING DIODE ASSEMBLY FOR AN ILLUMINATED SIGN

(75) Inventor: Sun-Tai Kim, Incheon (KR)

(73) Assignee: ATTO Display Co., Ltd., Gyeonggi-do (KR)

( * ) Notice: Subject to any disclaimer, the term of this patent is extended or adjusted under 35 U.S.C. 154(b) by 18 days.

(21) Appl. No.: 10/649,598

(22) Filed: Aug. 27, 2003

(65) Prior Publication Data

US 2004/0196636 A1 Oct. 7, 2004

(30) Foreign Application Priority Data

Apr. 3, 2003 (KR) .................................. 10-2003-0021010
May 7, 2003 (KR) .................................. 20-2003-0014096

(51) Int. Cl.[7] .............................. H05K 5/02; H05K 7/06; F21S 15/00
(52) U.S. Cl. ........................ 361/679; 361/728; 361/746; 362/545
(58) Field of Search ........................... 40/578, 541, 544, 40/550, 551, 564, 570; 257/81, 82, 88, 95, E31.099, E31.105, E25.019, E25.028; 361/728–730, 736, 679, 748, 752, 756; 362/555, 543–546, 559, 362, 367, 375, 368, 84, 800, 807, 808, 812; 116/202

(56) References Cited

U.S. PATENT DOCUMENTS

| | | | | |
|---|---|---|---|---|
| 5,276,591 A | * | 1/1994 | Hegarty ........................ | 362/31 |
| 5,526,236 A | * | 6/1996 | Burnes et al. ................. | 362/20 |
| 5,808,592 A | * | 9/1998 | Mizutani et al. .............. | 345/83 |
| 5,842,297 A | * | 12/1998 | Tung ............................ | 40/546 |
| 5,950,340 A | * | 9/1999 | Woo ............................ | 40/564 |
| 6,042,248 A | | 3/2000 | Hannah et al. | |
| 6,481,130 B1 | * | 11/2002 | Wu ............................. | 40/546 |
| 6,505,956 B1 | | 1/2003 | Priddy et al. | |
| 6,558,021 B2 | | 5/2003 | Wu et al. | |
| 2002/0030992 A1 | * | 3/2002 | Lefebvre et al. ............ | 362/243 |
| 2002/0093832 A1 | * | 7/2002 | Hamilton .................... | 362/555 |
| 2003/0167666 A1 | * | 9/2003 | Close .......................... | 40/452 |
| 2003/0202349 A1 | * | 10/2003 | Suehiro et al. ............. | 362/245 |
| 2004/0022057 A1 | * | 2/2004 | Lee ............................. | 362/238 |
| 2004/0041521 A1 | * | 3/2004 | Mandler et al. ............ | 313/512 |

FOREIGN PATENT DOCUMENTS

DE 19741585 C1 * 10/1998 ......... H01L/25/075

* cited by examiner

Primary Examiner—Anatoly Vortman
(74) Attorney, Agent, or Firm—Hamilton, Brook, Smith & Reynolds, P.C.

(57) ABSTRACT

The light emitting diode assembly for an illuminated sign is disclosed having an enhanced waterproofs function and an enhanced durability. The light emitting diode assembly includes a case being open upwards, in which a connecting recess is formed on upper portions of both sides of the case. A printed circuit board is installed in the case and being mounted on upper sides of a plurality of light emitting diodes. The hollow cap is coupled in the connecting recess of the case, in which a plurality of wires passes through the cap. A synthetic resin material for covering the printed circuit board, the cap and the light emitting diode, is filled in the case. In this structure, the light emitting diode assembly can prevent the printed circuit board, transformer and the light emitting diode from being damaged by using an epoxy resin.

2 Claims, 4 Drawing Sheets

LIGHT EMITTING DIODE ASSEMBLY FOR AN ILLUMINATED SIGN

RELATED APPLICATION(S)

This application claims priority under 35 U.S.C. § 119 or 365 to Korean, Application No. 2003-14096, filed May 7, 2003 and Korean Application No. 2003-21010, filed Apr. 3, 2003. The entire teachings of the above application(s) are incorporated herein by reference.

BACKGROUND OF THE INVENTION

1. Field of the Invention

The prevent invention relates to a Light Emitting Diodes (LED), and more particularly to a light emitting diode assembly for an illuminated sign, which can be used as LED modules for various illuminating applications, such as a commercial sign, a street sign, a channel letter sign, etc.

2. Description of the Related Art

Since Light Emitting Diodes (LED) has a relatively low maintenance costs, a relatively high reliability and a relatively long lifetime, it has been used in many applications to replace a conventional incandescent lamp, a fluorescent lamp, a neon tube and fiber optic light sources.

Compared to conventional light source, LED consumes a relatively little electrical energy while exhibiting much longer life-time, and many LED designs are now being developed specifically for applications such as for channel letter signs utilizing LEDs.

One type of the light emitting diode module for an illuminated sign has been proposed, Light Emitting Diode Modules for Illuminated Sign, in U.S. Pat. No. 6,568,021 issued to Chen H. Wu on May 6, 2003. However, conventional Light Emitting Diode Modules may be used in Damp and Dry environments instead of wet environments. Accordingly, the integrity of the components thereof deteriorates because water penetrates into the inside of thereof. Also, Light Emitting Diode Modules exposed to the outside from a case, become susceptible to the outside impacts. Also, a connecting wire may be frequently shorted.

SUMMARY OF THE INVENTION

The present invention solves the foregoing problems. It is an object of the present invention to provide a light emitting diode assembly for an illuminated sign, which has an enhanced waterproof function and an enhanced durability.

It is another object of the present invention to provide a light emitting diode assembly for an illuminated sign with the design, which has a function of preventing a wire from shorting.

In order to achieve the above objects, the present invention provides a light emitting diode assembly for an illuminated sign, the light emitting diode assembly comprising:

a case being open upwards, in which a connecting recess is formed on upper portions of both sides of the case;

a printed circuit board being installed in the case and being mounted on upper sides of a plurality of light emitting diodes;

a hollow cap being coupled in the connecting recess of the case, in which a plurality of wires pass through the cap; and a synthetic resin material for covering the printed circuit board, the cap and the light emitting diode, the synthetic resin material being filled in the case.

The printed circuit board includes a transformer, a rectified circuit, a constant voltage circuit and a constant current circuit, in which the transformer drops the voltage so that a common alternating current supplied through the wires is coincided with or converted to a driving voltage of the light emitting diode, in which the rectified circuit transforms the alternating current to direct current voltage, and the constant voltage circuit and the constant current circuit adjust a intensity of a direct voltage supplied through the wire so that the direct voltage is coincided with or converted to the driving voltage of the light emitting diode.

The printed circuit board includes a constant voltage circuit and a constant current circuit for adjusting the intensity of a direct voltage supplied through the wires in order to harmonize the direct voltage with the driving voltage of the light emitting diode.

As described above, in the light emitting diode assembly for an illuminated sign according to the preferred embodiment of the present invention, the light emitting diode assembly includes a case being open upwards. The printed circuit board is installed in the case and is mounted on upper sides of a plurality of light emitting diode. The hollow cap is coupled in the connecting recess of the case. In this structure, the light emitting diode assembly can prevent the printed circuit board, transformer and the light emitting diode from being damaged by using an epoxy resin.

BRIEF DESCRIPTION OF THE DRAWINGS

The above objects and other characteristics and advantages of the present invention will become more apparent by describing in detail-preferred embodiments thereof with reference to the attached drawings, in which.

DETAILED DESCRIPTION OF THE PREFERRED EMBODIMENTS

Hereinafter, the light emitting diode assembly for an illuminated sign according to a preferred embodiment of the present invention will be explained in more detail with reference to the accompanying drawings.

Figure 1:
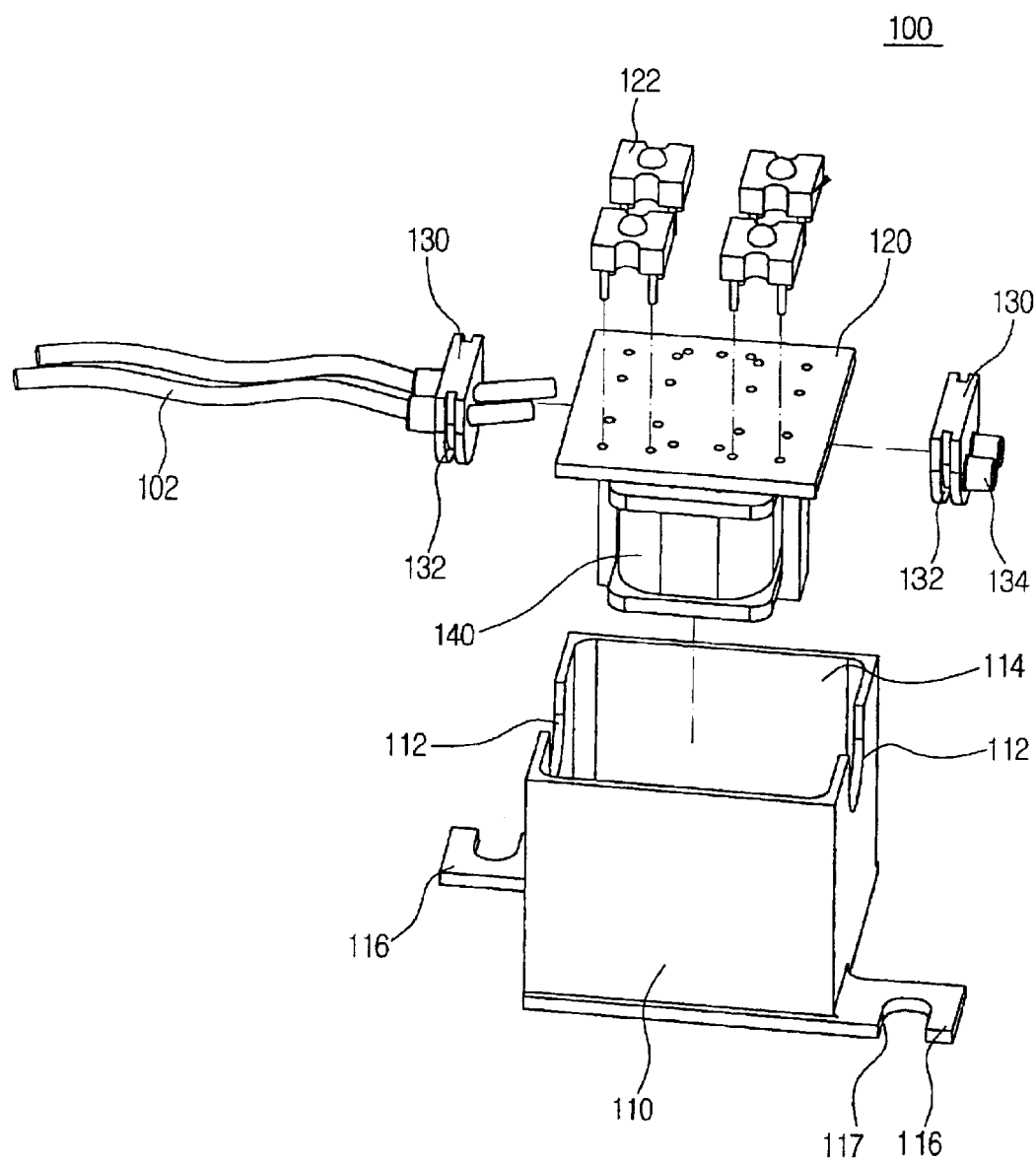
FIG. 1 is a view of the light emitting diode assembly for an illuminated sign according to a preferred embodiment of the present invention.
Figure 2:
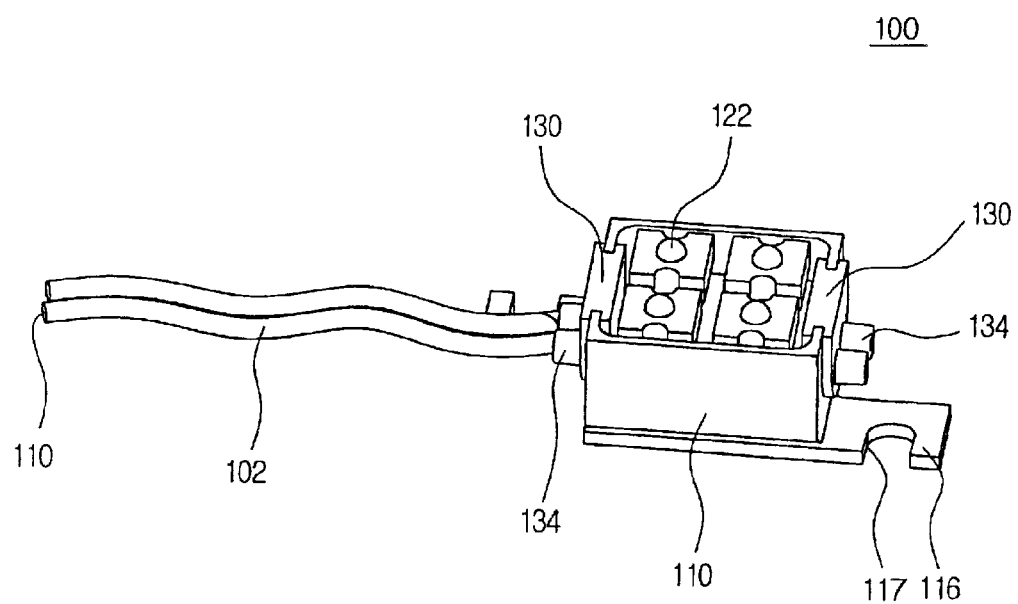
FIG. 2 is an exploded view of the light emitting diode assembly for an illuminated sign according to the preferred embodiment of the present invention, showing an installed state thereof.
Figure 3:
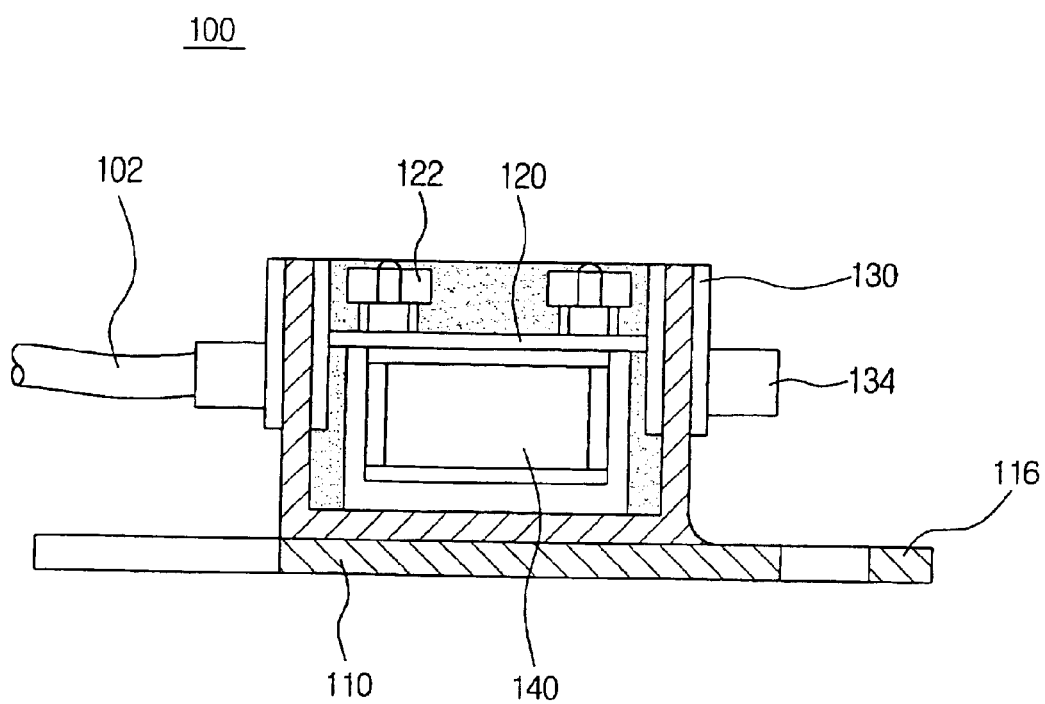
FIG. 3 is a sectional view taken along line A—A of FIG. 2.
Figure 4:
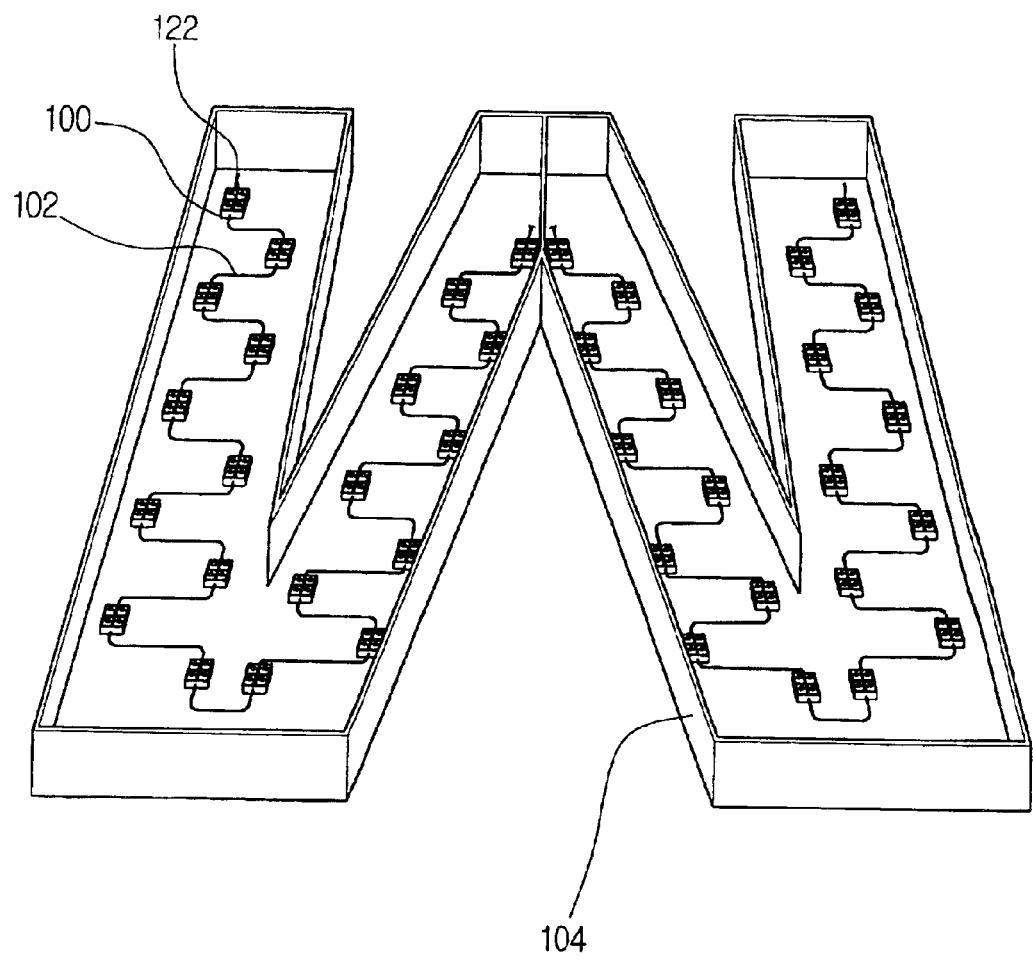
FIG. 4 is an exploded view of the light emitting diode assembly for an illuminated sign of FIG. 1, for showing an application thereof.

FIG. 1 shows an exploded state of the light emitting diode assembly for an illuminated sign according to the preferred embodiment of the present invention. Referring to FIG. 1, the light emitting diode assembly 100 is disposed on an illuminated sign 104.

Referring to FIG. 1, the light emitting diode assembly 100 has a case 110. A receiving chamber is formed at the case 114 and upwardly opened. A coupling recess 112 is formed at upper portions of both of the outside walls of the case 114. Preferably, the coupling recess 112 has a semi-circular shape. A connecting bracket 116 protrudes from lower ends of both sides of the case 110 in an opposite direction. A screw recess 117 is formed in the connecting bracket 116.

The printed circuit board 120 includes a transformer 140, a rectifier circuit, a constant voltage circuit and a constant current circuit. The transformer 140 drops the voltage, and thereby common alternating current supplied from the wires 102 is coincided with or converted to the driving voltage of the light emitting diode 122. The rectifier circuit converts alternating current to direct current voltage. The constant voltage circuit and the constant current circuit adjust a direct voltage supplying from the wire so that the direct voltage is coincided with or connected to the driving voltage of the light emitting diode 122.

Also, the printed circuit board 120 includes the constant voltage circuit and the constant current circuit for adjusting a direct voltage supplying from the wire in order to harmonize the direct voltage with the driving voltage of the light emitting diode 122.

A printed circuit board 120 is installed in the case 110. A plurality of light emitting diodes 110 is mounted on an upper side of the printed circuit board 120. The printed circuit board 120 includes a transformer 140, a rectified circuit, a constant voltage circuit and a constant current circuit. The transformer 140 drops the voltage so that a common alternating current supplied through the wires 102 is coincided with or converted to a driving voltage of the light emitting diode 122. The rectifier circuit transforms the alternating current to direct current voltage. The constant voltage circuit and the constant current circuit adjust the intensity of a direct voltage supplied through the wire so that the direct voltage is coincided with the driving voltage of the light emitting diode 122.

A plurality of caps 130 is inserted into a coupling groove 112 of the case 110, respectively. An upper portion of the cap 130 is formed as a linear line, and a lower thereof is formed as a semicircular shape corresponding to the coupling groove 112 of the case 110. A plurality of wires 102 perpendicularly passes through the center portion of the cap 130. The coupling groove 132 is formed at a lower edge of the cap 130, which is inserted into the connecting recess 112 of the case 110. A pair of guiding pipes 134 protrudes outwardly from the one side of the cap 130 for passing the wire 102 through A synthetic resin material is filled in the case 110 to cover the circuit printed board 120, and the cap 130 and the light emitting diode 122. Preferably, the synthetic resin material comprises an epoxy resin.

Hereinafter, the assembled state of the light emitting diode assembly for an illuminated sign according to the preferred embodiment of the present invention as above will be described in detail.

At first, a plurality of light emitting diodes 122 are installed at a plurality of upper sides of the printed circuit boards 120, respectively. A postal end of the wire 102 are fixed at a lower end of the printed circuit board 120 by means of a solder or a pin structure. The wires 102 are connected to both ends of the printed circuit board 120. The transformer 140 is installed at a lower portion of the printed circuit board 120.

The printed circuit board 120, which is connected to the wire 102 and the transformer 140, are mounted on the receiving chamber 114 of the case 110. At this time, the wire 102 is installed at the case by using the cap 130. That is, each of the wires 102 passes through the guiding pipes 134. And then, the cap 130 is coupled to the connecting recess 112 of the case 110. The semicircular portion of the lower portion of the cap 130 is inserted into the connecting recess 112, and then the coupling groove 132 is closely adhered to the edge of the connecting recess 112 of the case 110.

When a worker fills the receiving chamber 114 of the case 110 with synthetic resin such as epoxy resin, the epoxy resin covers the transformer 140 the printed circuit board 120 and the light emitting diode 122. Accordingly they are not exposed to the outside of the case 110.

The light emitting diode assembly 100 is installed on the illuminated sign 104 by screw means. The screw means is fixed at the illuminated sign 104 through a screw recess 117 of the connecting bracket 116. The light emitting diode assembly 100, also, may be installed on the illuminated sign 104 by using various adhering materials, such as an adhesive agent or a double tape instead of the screw mean. The light emitting diode assembly 100 may be disposed on the upper side of the illuminated sign 104 in a zigzag shape. The light emitting diode assemblies 100 are connected with each other by using the wire 102.

Under this state, the light emitting diode 122 receives alternating voltage or direct voltage from the wire 102.

The transformer 140 drops the voltage so that a common alternating current supplied through the wires 102 is coincided with or converted to the driving voltage of the light emitting diode 122. The rectifier circuit transforms the alternating current to direct current voltage. The constant voltage circuit and the constant current circuit adjust a intensity of a direct voltage supplied through the wire so that the direct voltage is coincided with or converted to the driving voltage of the light emitting diode 122.

The direct voltage supplied from the wire 102 maintains the voltage for adjusting the direct voltage from the wire 102 to the driving voltage of the light emitting diode 122.

As described above, in the light emitting diode assembly for an illuminated sign according to the preferred embodiment of the present invention, it is possible to prevent a wire from shorting when the wire passes through the case by using the cap, which is made of PVC. Also, it is possible to prevent the printed circuit board, transformer and the light emitting diode from being damaged by using an epoxy resin. The epoxy resin can cover the printed circuit board, transformer and the light emitting diode.

Meanwhile, when alternating voltage is supplied to the printed circuit board, the light emitting diode has a regular luminosity by supplying the voltage to adjust the driving voltage of the light emitting diode from the constant current and the constant voltage. While direct voltage is supplied to the printed circuit board, the light emitting diode has a regular luminosity by supplying the voltage circuits in order to harmonize the driving voltage of the light emitting diode from the constant current and the constant voltage circuits.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A light emitting diode assembly for an illuminated sign, the light emitting diode assembly comprising:
   a case being open upwards, in which a connecting recess is formed on upper portions of both sides of the case;
   a printed circuit board being installed in the case and being mounted on upper sides of a plurality of light emitting diodes;
   a hollow cap being coupled in the connecting recess of the case, in which a plurality of wires pass through the cap, wherein the cap includes a guiding pipe, in which a coupling groove is formed along a lower edge of the cap so that the cap is inserted into the connecting recess of the case, in which the guiding pipe outwardly protrudes from one side of the guiding pipe; and a synthetic resin material for covering the printed circuit board, the cap and the light emitting diode, the synthetic resin material being filled in the case.

2. The light emitting diode assembly for an illuminated sign as claimed in claim 1, wherein the synthetic resin material comprises an epoxy resin.

* * * * *